United States Patent
Li et al.

(10) Patent No.: US 9,377,581 B2
(45) Date of Patent: Jun. 28, 2016

(54) ENHANCING THE PERFORMANCE OF LIGHT SENSORS THAT RECEIVE LIGHT SIGNALS FROM AN INTEGRATED WAVEGUIDE

(71) Applicant: Kotura, Inc., Monterey Park, CA (US)

(72) Inventors: Zhi Li, Alhambra, CA (US); Dazeng Feng, El Monte, CA (US); Shirong Liao, Mira Loma, CA (US); Zhou Zhou, San Diego, CA (US); C C Kung, San Gabriel, CA (US); Roshanak Shafiiha, La Canada-Flintridge, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 372 days.

(21) Appl. No.: 13/889,890

(22) Filed: May 8, 2013

(65) Prior Publication Data

US 2014/0332918 A1 Nov. 13, 2014

(51) Int. Cl.
*H01L 31/0232* (2014.01)
*G02B 6/122* (2006.01)
*H01L 31/0352* (2006.01)
*G02B 6/12* (2006.01)
*G02B 6/42* (2006.01)

(52) U.S. Cl.
CPC .......... *G02B 6/1228* (2013.01); *G02B 6/12004* (2013.01); *H01L 31/02327* (2013.01); *H01L 31/0352* (2013.01); *G02B 6/4202* (2013.01); *G02B 6/4207* (2013.01); *G02B 2006/12097* (2013.01)

(58) Field of Classification Search
CPC ........... G02B 6/12004; G02B 6/12002; G02B 6/1228; G02B 6/42

USPC .......................................................... 257/432
See application file for complete search history.

(56) References Cited

U.S. PATENT DOCUMENTS

| | | | |
|---|---|---|---|
| 3,242,606 | A | 3/1966 | Harrick |
| 3,242,805 | A | 3/1966 | Harrick |
| 3,753,157 | A | 8/1973 | Ash |
| 4,784,452 | A | 11/1988 | Hodge |
| 4,899,200 | A | 2/1990 | Shur |
| 4,923,264 | A | 5/1990 | Langer |

(Continued)

FOREIGN PATENT DOCUMENTS

| | | |
|---|---|---|
| JP | 62165981 | 7/1987 |
| WO | WO2007/002953 | 1/2007 |

(Continued)

OTHER PUBLICATIONS

D. Ahn, C-Y. Hong, J. Liu, W. Giziewics, M. Beals, L. C. Kimerling, and J. Michel, *High performance, waveguide integrated Ge photodetectors*, Opt. Express, 15, 3916 (2007).

(Continued)

*Primary Examiner* — Tina Wong
(74) *Attorney, Agent, or Firm* — Gavrilovich, Dodd & Lindsey, LLP

(57) ABSTRACT

The light sensor and waveguide are positioned on a base such that a light signal guided by the waveguide is received at the light sensor. The waveguide includes a taper configured such that a ratio of a width of the waveguide at a first location in the taper:the width of the waveguide at a second location in the taper is greater than 1.2:1 where a length of the taper between the first location and the second location is less than 60 μm.

20 Claims, 8 Drawing Sheets

(56) References Cited

U.S. PATENT DOCUMENTS

| | | | |
|---|---|---|---|
| 5,159,700 A | 10/1992 | Reid | |
| 5,285,514 A | 2/1994 | Nojiri | |
| 5,448,536 A | 9/1995 | Muranishi | |
| 5,642,371 A | 6/1997 | Tohyama | |
| 5,866,936 A | 2/1999 | Hasnain | |
| 5,963,358 A | 10/1999 | Shields | |
| 6,104,047 A | 8/2000 | Watanabe | |
| 6,114,088 A | 9/2000 | Wolk | |
| 6,324,326 B1* | 11/2001 | Dejneka et al. | 385/123 |
| 6,924,510 B2 | 8/2005 | Gardner | |
| 6,970,611 B1 | 11/2005 | van der Vliet | |
| 6,978,067 B2 | 12/2005 | Herbert | |
| 7,120,350 B2 | 10/2006 | Block | |
| 7,308,166 B1 | 12/2007 | Peng | |
| 7,339,724 B2 | 3/2008 | Hochberg | |
| 7,397,101 B1 | 7/2008 | Masini | |
| 7,603,301 B1 | 10/2009 | Regan | |
| 7,643,714 B2 | 1/2010 | Hochberg | |
| 8,053,790 B2* | 11/2011 | Feng | G02B 6/12004 257/85 |
| 8,242,432 B2* | 8/2012 | Feng | G02B 6/12004 250/214 R |
| 8,639,065 B2* | 1/2014 | Feng | H01L 31/1075 385/12 |
| 2002/0074555 A1 | 6/2002 | Kim | |
| 2002/0117697 A1 | 8/2002 | Tanaka | |
| 2002/0181067 A1 | 12/2002 | Romanovsky | |
| 2002/0191916 A1 | 12/2002 | Frish | |
| 2003/0016896 A1 | 1/2003 | Azarbar | |
| 2003/0164444 A1 | 9/2003 | Yoneda | |
| 2005/0018276 A1 | 1/2005 | Kourogi | |
| 2005/0025443 A1 | 2/2005 | Nakaji | |
| 2005/0167709 A1 | 8/2005 | Augusto | |
| 2005/0212068 A1 | 9/2005 | Leon | |
| 2006/0039666 A1 | 2/2006 | Knights | |
| 2006/0289957 A1 | 12/2006 | Morse | |
| 2007/0104411 A1 | 5/2007 | Ahn | |
| 2007/0170476 A1 | 7/2007 | Giziewicz | |
| 2007/0189688 A1 | 8/2007 | Dehlinger | |
| 2008/0012104 A1 | 1/2008 | Pauchard | |
| 2008/0225267 A1 | 9/2008 | Murtagh | |
| 2008/0272391 A1 | 11/2008 | Kapur | |
| 2009/0022452 A1 | 1/2009 | Welch | |
| 2009/0127645 A1 | 5/2009 | Knights | |
| 2010/0207223 A1 | 8/2010 | Feng | |
| 2011/0068425 A1 | 3/2011 | Liao | |
| 2011/0095167 A1* | 4/2011 | Feng | G02B 6/12004 250/207 |
| 2011/0170819 A1* | 7/2011 | Zheng et al. | 385/2 |
| 2012/0207424 A1* | 8/2012 | Zheng et al. | 385/2 |
| 2013/0209112 A1* | 8/2013 | Witzens | 398/214 |

FOREIGN PATENT DOCUMENTS

| | | |
|---|---|---|
| WO | WO2007/049260 | 5/2007 |
| WO | WO2010/096148 | 8/2010 |

OTHER PUBLICATIONS

Coldren, et al., Diode Lasers and Photonic Integrated Circuits, Wiley Series in Microwave and Optical Engineering (1995) pp. 355-359.

Dai, et al., "Resonant Normal-Incidence Separate-Absorption-Charge-Multiplication Ge/Si Avalanche Photodiodes," Sep. 14, 2009/ vol. 17, No. 19/Optics Express, pp. 1-9.

Jutzi et al., *Ge-on-So vertical incidence Photodiodes with 39-GHz Bandwidth*, IEEE Photonics TechnologyLetters, vol. 17, No. 7, Jul. 2005 (pp. 1510-1512).

Liu, et al., "Design of Monolithically Integrated GeSi Electro-Absorption Modulators and Photodetectors on an SOI Platform," Jan. 22, 2006/ vol. 15, No. 2/Optics Express, pp. 1-6.

Liu et al., *Tensile strained Ge p-I-n photodetectors on Si platform for C and L band telecommunications*, Appl. Phys. Lett. 87, 011110 (2005) (pp. 1-3).

Liu, et al., "Waveguide-Integrated, Ultralow-Energy GeSi Electroabsorption Modulators," Nature photonics/vol. 2/ Jul. 2008, pp. 433-437.

Rouviere et al., *Integration of germanium waveguide photodetectors for intrachip optical interconnects*, Optical Engineering 44(7), 075402 (Jul. 2005) (pp. 1-5).

Vivien et al., *High speed and high responsivity germanium photodetector integrated in a Silicon-On-Insulator microwaveguide*, Jul. 23, 2007/ vol. 15, No. 15/Optics Express (pp. 9843-9845).

L. Vivien, J. Osmond, J.-M. Fedeli, D. Marris-Morini, P. Crozat, J.-F. Damlencourt, E. Cassan, Y. Lecunff, S. Laval, *42 GHz p.i.n. Germanium photodetector integrated in a silicon-on-inculator waveguide*, Opt. Express 17, 6252 (2008).

J. Wang, W. Y. Loh, K. T. Chua, H. Zang, Y. Z. Xiong, S. M. F. Tan, M. B. Yu, S. J. Lee, G. Q. Lo, and D. L. Kwong, *Low-voltage high-speed (18GHz/1V) evanescent-coupled thin-file-Ge lateral PIN photodetectors integrated on Si waveguide*, IEEE Photon. Technol. Lett., 17, 1485 (2008).

Yin et al., *31 GHz Ge n-I-p waveguide photodetectors on Sililcon-on-Insulator substrate*, Oct. 17, 2007/Vpl. 15, No. 21/Optics Express (pp. 13965-13971).

Zaoul, et al., "Origin of the Gain-Bandwidth-Product Enhancement in Separate-Absorption-Charge-Multiplication Ge/Si Avalanche Photodiodes," OSA/OFC/NFOEC, pp. 1-3 (2009).

\* cited by examiner

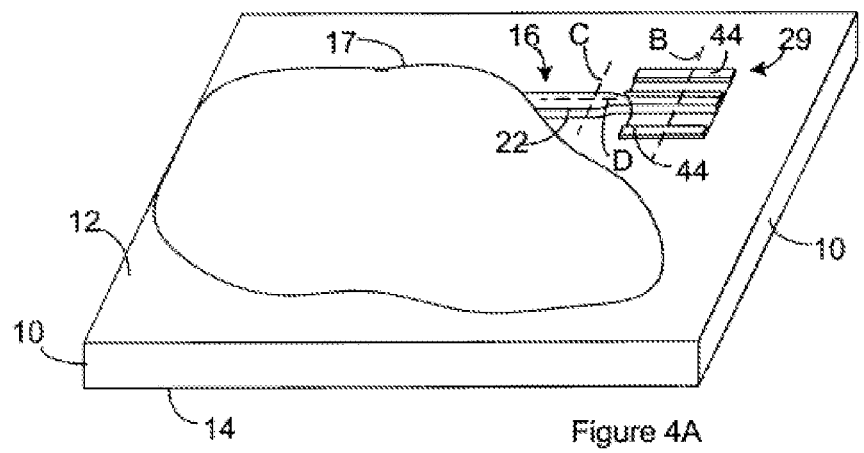
Figure 4A
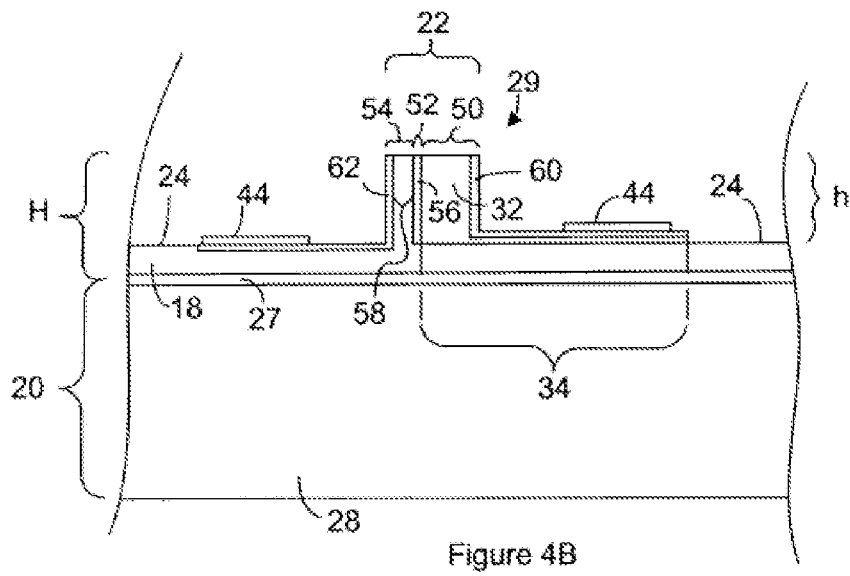
Figure 4B
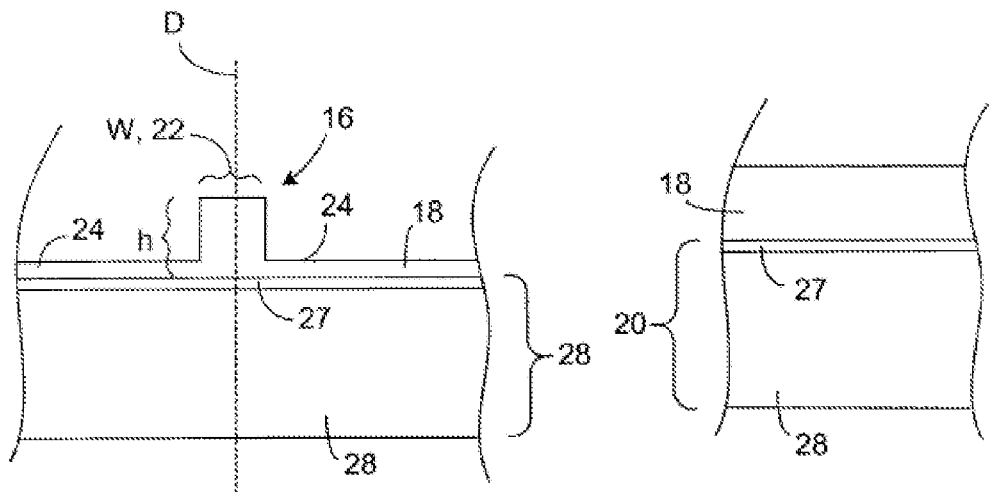
Figure 4C
Figure 4D

ENHANCING THE PERFORMANCE OF LIGHT SENSORS THAT RECEIVE LIGHT SIGNALS FROM AN INTEGRATED WAVEGUIDE

FIELD

The present invention relates to optical devices and more particularly to devices having a light sensor.

BACKGROUND

The use of optical and/or optoelectronic devices is increasing in communications applications. These devices can include light sensors that receive light signals from a waveguide. These light sensors convert the received light signals to an electrical signal. Improving the sensitivity and/or bandwidth of these light sensors can improve the performance of a variety of systems which make use of these light sensors.

SUMMARY

The light sensor and waveguide are positioned on a base such that a light signal guided by the waveguide is received at the light sensor. The waveguide includes a taper configured such that a ratio of a width of the waveguide at a first location in the taper:the width of the waveguide at a second location in the taper is greater than 1.2:1 where a length of the taper between the first location and the second location is less than 5 µm, 10 µm, or 50 µm.

BRIEF DESCRIPTION OF THE FIGURES

FIG. 1A is a perspective view of the device.

FIG. 1B is a cross-section of the device shown in FIG. 1A taken along the line labeled B.

FIG. 1C is a cross-section of the device shown in FIG. 1A taken along the line labeled C.

FIG. 1D is a cross-section of the optical device shown in FIG. 1C taken along the line labeled D and extending parallel to the longitudinal axis of the waveguide.

FIG. 4A through FIG. 4D illustrate an optical device having a light sensor configured to receive light signals from a waveguide. FIG. 4A is a perspective view of the device.

FIG. 4B is a cross-section of the device shown in FIG. 4A taken along the line labeled B.

FIG. 4C is a cross-section of the device shown in FIG. 4A taken along the line labeled C.

FIG. 4D is a cross-section of the optical device shown in FIG. 4C taken along the line labeled D and extending parallel to the longitudinal axis of the waveguide.

FIG. 6A is a topview of the taper.

FIG. 6B is a cross section of the taper shown in FIG. 6A taken along the line labeled B in FIG. 6A.

DESCRIPTION

A light sensor receives a light signal from a waveguide. Because these light sensors operate more efficiently when they are narrow, the waveguide tapers before delivering the light signal to the light sensor. In prior art, these tapers are long in order to prevent or reduce the excitation of higher order modes. When higher order modes are excited in single mode waveguides, the higher order modes are normally a source of loss in the system. In this instance, the inventors have unexpectedly found that using an abrupt taper actually increases the sensitivity and/or bandwidth of the light sensor. Without being bound to theory, the increase in sensitivity and/or bandwidth is believed result from the abrupt taper not giving the light signal enough time to move into the lower portion of the waveguide where the sensitivity of the light sensor is reduced.

Figure 1A:
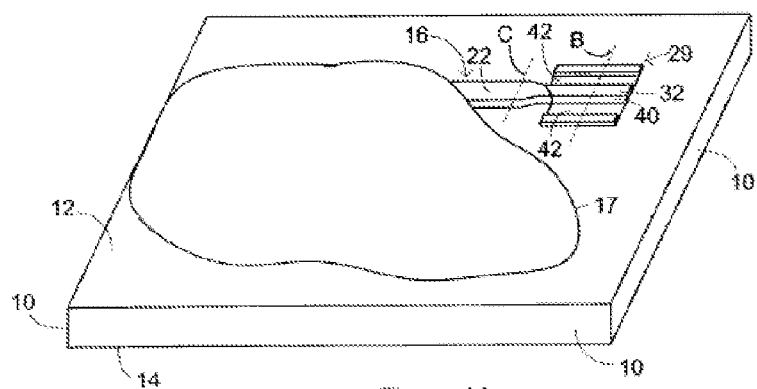
FIG. 1A through FIG. 1D illustrate an optical device having a light sensor configured to receive light signals from a waveguide. The light sensor includes field sources that are configured to generate a substantially horizontal electrical field in a light-absorbing medium. The device illustrated in FIG. 1A through FIG. 1D employs doped regions of the light-absorbing medium as the field sources.
Figures 1B, 1C:
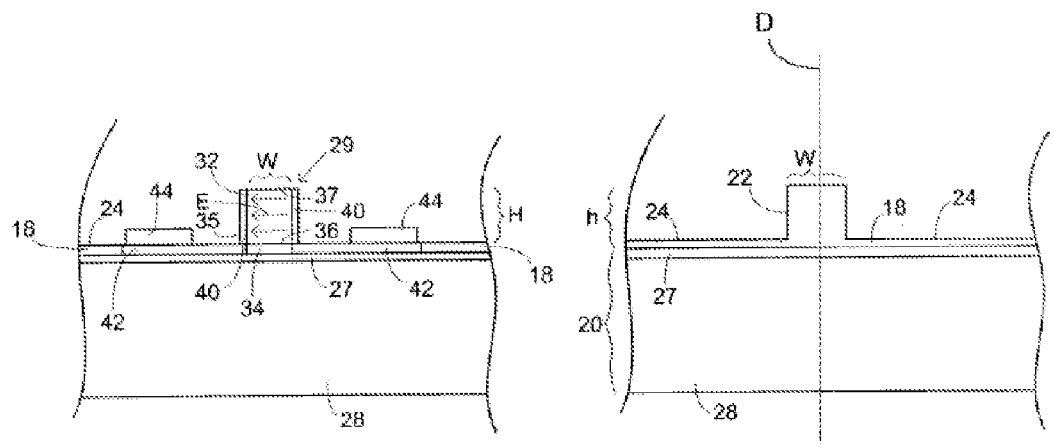
Figure 1D:
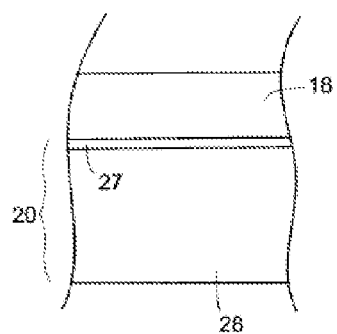

FIG. 1A through FIG. 1D illustrate an optical device having a light sensor configured to receive light signals from a waveguide. FIG. 1A is a perspective view of the device. FIG. 1B is a cross-section of the light sensor. For instance, FIG. 1B is a cross-section of the device shown in FIG. 1A taken along the line labeled B. FIG. 1C is a cross-section of the waveguide. For instance, FIG. 1C is a cross-section of the device shown in FIG. 1A taken along the line labeled C. FIG. 1D is a cross-section of the optical device shown in FIG. 1C taken along the line labeled D and extending parallel to the longitudinal axis of the waveguide.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 10 (or edges) extending from a top side 12 to a bottom side 14. The propagation direction of light signals along the length of the waveguides on a planar optical device generally extends through the lateral sides 10 of the device. The top side 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, light sensors that convert an light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

The waveguide 16 is defined in a light-transmitting medium 18 positioned on a base 20. For instance, the waveguide 16 is partially defined by a ridge 22 extending upward from a slab region of the light-transmitting medium. In some instances, the top of the slab region is defined by the bottom of trenches 24 extending partially into the light-transmitting medium 18 or through the light-transmitting medium 18. Suitable light-transmitting media include, but are not limited to, silicon, polymers, silica, SiN, GaAs, InP and $LiNbO_3$. One or more cladding layers are optionally positioned on the light-transmitting medium. The one or more cladding layers can serve as a cladding for the waveguide 16 and/or for the device. When the light-transmitting medium 18 is silicon, suitable cladding layers include, but are not limited to, silicon, polymers, silica, SiN, GaAs, InP and $LiNbO_3$.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 27 with a lower index of refraction than the light-transmitting medium 18. The drop in the index of refraction can cause reflection of a light signal from the light-transmitting medium 18 back into the light-transmitting medium 18. The base 20 can include the optical insulator 27 positioned on a substrate 28. As will become evident below, the substrate 28 can be configured to transmit light signals. For instance, the substrate 28 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serve as the optical insulator 27 and the silicon substrate can serve as the substrate 28.

The optical device also includes a light sensor 29 configured to receive a light signal guided by the one or more waveguides 16. The light sensor 29 is configured to convert the light signal to an electrical signal. Accordingly, the light signal can be employed to detect receipt of light signals. For instance, the light sensor 29 can be employed to measure the intensity of a light signal and/or power of a light signal. Although FIG. 1A illustrates a waveguide 16 carrying the light signal between the one or more components and the light sensor 29, the device can be constructed such that the waveguide 16 carries the light signal directly from an optical fiber to the light sensor 29.

A suitable light sensor 29 includes a light-absorbing medium 32 that absorbs light signals. The light-absorbing medium 32 is positioned to receive at least a portion of a light signal traveling along the waveguide 16. As is evident from FIG. 1A, there is an interface between a facet of the light-absorbing medium 32 and a facet of the light-transmitting medium 18. The interface can have an angle that is non-perpendicular relative to the direction of propagation of light signals through the waveguide 16 at the interface. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The light-absorbing medium 32 of the light sensor 29 is positioned on a seed portion 34 of the light-transmitting medium 18. The seed portion 34 of the light-transmitting medium 18 is positioned on the base 20. In particular, the seed portion 34 of the light-transmitting medium 18 contacts the insulator 27. The seed portion 34 of the light-transmitting medium 18 can be continuous with the light-transmitting medium 18 included in the waveguide 16 or spaced apart from the waveguide 16. When the light signal enters the light sensor, a portion of the light signal can enter the seed portion 34 of the light-transmitting medium 18 and another portion of the light signal enters the light-absorbing medium 32. Accordingly, the light-absorbing medium 32 can receive only a portion of the light signal. In some instances, the light sensor can be configured such that the light-absorbing material receives the entire light signal.

During the fabrication of the device, the seed portion 34 of the light-transmitting medium 18 can be used to grow the light-absorbing medium 32. For instance, when the light-transmitting medium 18 is silicon and the light-absorbing medium 32 is germanium, the germanium can be grown on the silicon. As a result, the use of the light-transmitting medium 18 in both the waveguides 16 and as a seed layer for growth of the light-absorbing medium 32 can simplify the process for fabricating the device.

During operation of the light sensor 29, a reverse bias electrical field is applied across the light-absorbing medium 32. When the light-absorbing medium 32 absorbs a light signal, an electrical current flows through the light-absorbing medium 32. As a result, the level of electrical current through the light-absorbing medium 32 indicates receipt of a light signal. Additionally, the magnitude of the current can indicate the power and/or intensity of the light signal. Different light-absorbing media 32 can absorb different wavelengths and are accordingly suitable for use in a sensor 29 depending on the function of the sensor 29. A light-absorbing medium 32 that is suitable for detection of light signals used in communications applications includes, but are not limited to, germanium, silicon germanium, silicon germanium quantum well, GaAs, and InP. Germanium is suitable for detection of light signals having wavelengths in a range of 1300 nm to 1650 nm.

The light sensor can be configured to apply an electric field to the light-absorbing medium 32 that is substantially parallel to the base 20. For instance, the light-absorbing medium 32 can include lateral sides 35 that connect a bottom side 36 and a top side 37. The bottom side is located between the top side and the base 20. In some instances, the lateral sides are substantially perpendicular relative to the base 20.

The lateral sides of the light-absorbing medium 32 can include doped regions 40. As is evident from FIG. 1B, each of the doped regions 40 can extend up to the top side of the light-absorbing medium 32. Each of the doped regions 40 can be an N-type doped regions or a P-type doped region. For instance, each of the N-type doped regions can include an N-type dopant and each of the P-type doped regions can include a P-type dopant. In some instances, the light-absorbing medium 32 includes a doped region 40 that is an N-type doped region and a doped region 40 that is a P-type doped region. The separation between the doped regions 40 in the light-absorbing medium 32 results in the formation of PIN (p-type region-insulator-n-type region) junction in the light sensor 29.

In the light-absorbing medium 32, suitable dopants for N-type regions include, but are not limited to, phosphorus and/or arsenic. Suitable dopants for P-type regions include, but are not limited to, boron. The doped regions 40 are doped so as to be electrically conducting. A suitable concentration for the P-type dopant in a P-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^3$.

The light-transmitting medium 18 also includes doped regions 42. Each doped region 42 in the light-transmitting medium 18 contacts one of the doped regions 40 in the light-absorbing medium 32. A doped region 42 in the light-transmitting medium 18 and the contacted doped region 40 are the same type of doped region. For instance, when a doped region 40 in the light-absorbing medium 32 is a P-type region, that doped region 40 contacts a P-type doped region in the light-transmitting medium 18. As a result, in some instances, one of the doped regions 42 in the light-transmitting medium 18 is a P-type doped region and one of the doped regions 42 in the light-transmitting medium 18 is an N-type doped region.

In the light-transmitting medium 18, suitable dopants for N-type regions include, but are not limited to, phosphorus and/or arsenic. Suitable dopants for P-type regions include, but are not limited to, boron. The doped regions 42 are doped so as to be electrically conducting. A suitable concentration for the P-type dopant in a P-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

Each doped region 42 in the light-transmitting medium 18 is in contact with an electrical conductor 44 such as a metal. Accordingly, the each of the doped regions 42 in the light-transmitting medium 18 provides electrical communication between an electrical conductor 44 and one of the doped regions 40 in the light-absorbing medium 32. As a result, electrical energy can be applied to the electrical conductors 44 in order to apply the electric field to the light-absorbing medium 32. As is evident from the arrows labeled E in FIG. 1B, the doped regions 40 in the light-absorbing medium 32 serve as the field sources for the electrical field. As a result, the resulting electrical field is substantially parallel to the base 20.

Figure 2A:
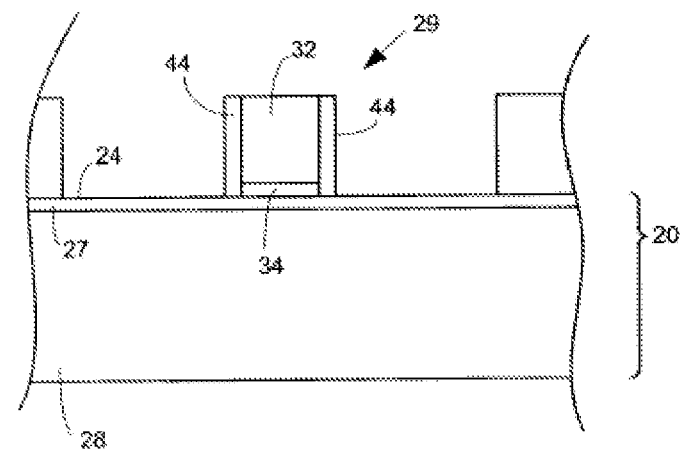
FIG. 2A is a cross-section of a light sensor that employs electrical conductors as field sources.

Rather than using doped regions 40 in the light-absorbing medium 32 as the field sources, electrical conductors 44 such as metal can be used as the field sources. For instance, FIG. 2A is a cross-section of a light sensor that employs electrical conductors 44 as field sources. The electrical conductors 44 extend from the base 20 to the top side of the light-absorbing medium 32. For instance, FIG. 2A illustrates the electrical conductors 44 extending from the insulator 27 to the top side of the light-absorbing medium 32. The seed portion 34 of the light-transmitting medium 18 is between the base 20 and the light-absorbing medium 32.

Figure 2B:
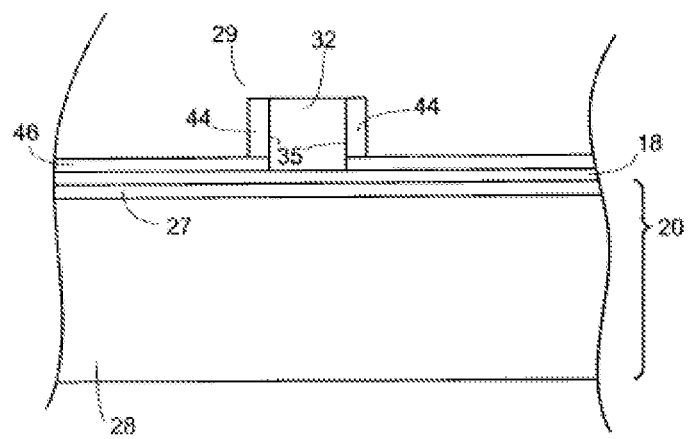
FIG. 2B is a cross-section of a light sensor that employs electrical conductors as field sources. The electrical conductors are elevated above the height of the electrical conductors shown in FIG. 2A.

As is evident from FIG. 2A, the electrical conductors 44 can contact the base 20. However, the electrical conductors 44 can be spaced apart from the base 20 as illustrated in FIG. 2B. In FIG. 2B, a spacer layer 46 is formed on top of the light-transmitting medium 18 and against the lateral sides of the light-absorbing medium 32. The electrical conductors 44 extend from the top of the spacer layer 46 to the top side of the light-absorbing medium 32. As a result, the spacer layer 46 elevates the bottom of the electrical conductors 44 relative to the base 20. The electrical conductors 44 are also elevated above the interface between the light-absorbing medium 32 and the seed portion 34 of the light-transmitting medium 18. The elevation of the electrical conductors 44 reduces interaction between the resulting electrical field and the interface between the light-absorbing medium 32 and the seed portion 34 of the light-transmitting medium 18. This reduced interaction may further reduce the level of dark current associated with the light sensor.

Figure 2C:
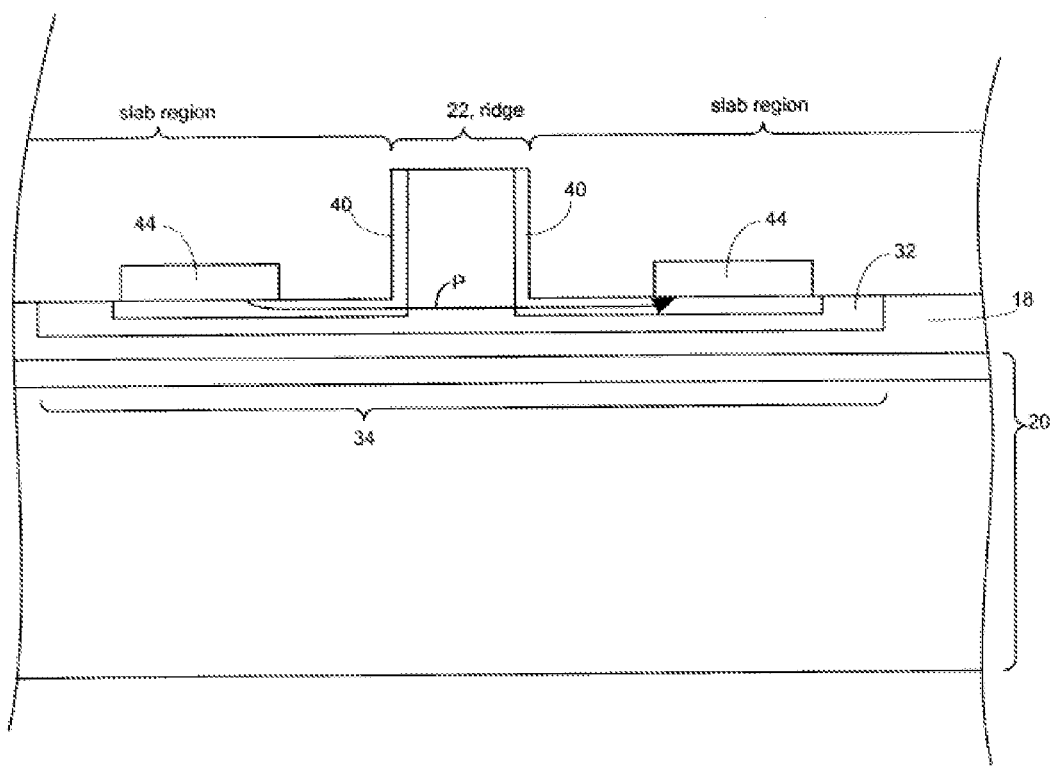
FIG. 2C is a cross-section of a light sensor having a light-absorbing medium positioned such that the doped regions are located only in the light-absorbing medium but excluded from the light-transmitting medium.

FIG. 2C presents another constructions of the light sensor that can simplify the fabrication process. A ridge 22 of light-absorbing medium 32 extends upward from a slab region of the light-absorbing medium 32. The slab region of the light-absorbing medium 32 and the ridge 22 of the light-absorbing medium 32 are both positioned on a seed portion 34 of the light-transmitting medium 18. As a result, the seed portion 34 of the light-transmitting medium 18 is between the light-absorbing medium 32 and the base 20. The light-absorbing medium 32 can be grown on the seed portion of the light-transmitting medium 18.

The doped regions 40 of the light-absorbing medium 32 are positioned on the lateral sides of the ridge 22 of the light-absorbing medium 32. The doped regions 40 extend from the ridge 22 into the slab region of the light-absorbing medium 32. The transition of a doped region 40 from the ridge 22 of the light-absorbing medium 32 into the slab region of the light-absorbing medium 32 can be continuous and unbroken as is evident from FIG. 2C.

Electrical conductors 44 are positioned on the slab region of the light-absorbing medium 32. In particular, the electrical conductors 44 each contact a portion of a doped region 40 that is in the slab region of the light-absorbing medium 32.

The arrangement of FIG. 2C may have a simplified fabrication process relative to an arrangement such as illustrated in FIG. 2A. For instance, in FIG. 2A, doped regions 40 are formed in the light-transmitting medium 18 and also in the light-absorbing medium 32. Different conditions may be required to form these regions in the different materials. For instance, when the light-transmitting medium 18 is silicon and the light-absorbing medium 32 is germanium, it may be desirable to use different temperatures to form the doped regions 40 in the light-absorbing medium 32 than is used to form the doped regions 42 in the light-transmitting medium 18. However, since the arrangement of FIG. 2C requires that the doped regions be formed only in the light-absorbing medium, the arrangement of FIG. 2C may be simpler to fabricate.

The arrangement illustrated in FIG. 2C can also be associated with a reduction in dark current as a result of reducing interaction between the resulting electrical field and the interface between the light-absorbing medium 32 and the seed portion 34 of the light-transmitting medium 18. For instance, as can be seen from the arrows labeled P in 2C, at least a portion of the electrical field formed between the electrical conductors can form on a path through one of the slab regions, through a portion of the light-absorbing medium under the ridge, and then through the slab region without entering the light-transmitting medium. Since the illustrated path does not include the light-transmitting medium, the dark current may be reduced.

Although FIG. 2C illustrates each of the doped regions extending only part way into the light-absorbing medium included in the slab regions, one or more of the doped regions can extend through the light-absorbing medium. Accordingly, one or more of the doped regions can contact the light-transmitting medium 18. Further, one or more of the doped regions can extend through the light-absorbing medium and into the light-transmitting medium 18.

Increasing the portion of the lateral side of the ridge that is contacted by the field source can increase the efficiency of the light sensor. Accordingly, as is evident in FIG. 1A, FIG. 2A, and FIG. 2C, each of the field sources can span the distance between the top of the lateral side contacted by the field source and the bottom of the lateral side contacted by the field source. In some instances, each of the field sources extends from the top of the lateral side contacted by the field source toward the base 20. Alternately, each of the field sources can extend toward the base 20 from a location that is above 90% of a distance between the top of the lateral side contacted by the field source and the bottom of the lateral side contacted by the field source. Each of the field sources can extend toward the base 20 from a location that is above 80% of a distance between the top of the lateral side contacted by the field source and the bottom of the lateral side contacted by the field source. In one example, each of the field sources extends toward the base 20 from a location that is within 1.0 µm of a top of the lateral side contacted by that field source.

As noted above, the light sensor is suitable for use with waveguide dimensions that are suitable for use in communications applications. Accordingly, a suitable height for the waveguide 16 (labeled h in FIG. 1C) includes, but is not limited to, heights greater than 1 µm, 2 µm, and 3 µm. A suitable width for the waveguide 16 (labeled w in FIG. 1C) includes, but is not limited to, widths greater than 0.3 µm, 1 µm, and 3 µm. Suitable waveguide dimension ratios (width of the waveguide 16:height of the waveguide 16) include, but are not limited to, ratios greater than 0.1:1, 0.3:1, and 0.5:1 and/or less that 0.7:1, 1:1, and 2:1. A suitable thickness for the slab regions adjacent to the waveguide includes, but is not limited to, a thickness greater than 0.1 µm, 0.2 µm, or 0.3 µm and/or less than 0.4 µm, 0.5 µm, or 1 µm.

The increased dimensions of the waveguide 16 are also associated with increased dimensions of the light-absorbing medium 32. For instance, a suitable height for the light-absorbing medium 32 (labeled H in FIG. 1B) includes, but is not limited to, heights greater than 1 µm, 2 µm, and 3 µm. A suitable width for the light-absorbing medium 32 (labeled W in FIG. 1B) includes, but is not limited to, widths greater than 0.3 µm, 0.5 µm, and 1 µm. Suitable light-absorbing medium 32 dimension ratios (width of the waveguide 16:height of the waveguide 16) include, but are not limited to, ratios greater than 0.1:1, 0.3:1, and 0.5:1 and/or less than 0.7:1, 1:1, and 2:1. A suitable thickness for the slab regions adjacent to the light-absorbing medium 32 includes, but is not limited to, a thickness greater than 0.1 µm, 0.15 µm, or 0.2 µm and/or less than 0.25 µm, 0.3 µm, or 0.35 µm.

Figure 3:
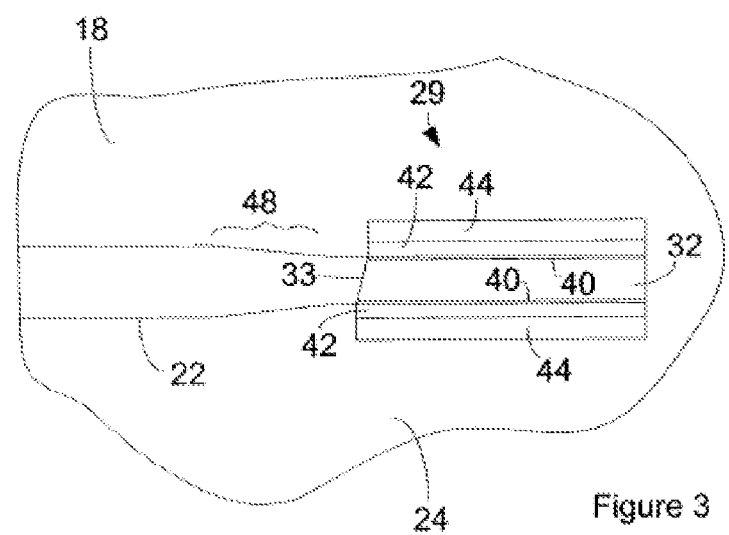
FIG. 3 is a topview of the portion of optical device where the waveguide is interfaced with the light sensor. The waveguide includes a taper.

FIG. 3 is a topview of the portion of an optical device according to any of FIG. 1 through FIG. 2C where the waveguide 16 is interfaced with the light sensor. The waveguide includes a taper 48. The taper 48 can be a horizontal taper and need not include a vertical taper although a vertical taper is optional. The taper 48 is positioned before the light sensor. For instance, the horizontal taper occurs in the light-transmitting medium 18 rather than in the light-absorbing medium 32. The taper 48 allows the light-absorbing medium 32 to have a narrower width than the waveguide 16. The reduced width of the light-absorbing medium 32 increases the speed of the light sensor. The optical component preferably excludes additional components between the taper and light sensor although other components may be present. Although FIG. 3 illustrates the light sensor constructed according to FIG. 1A, the light sensor of FIG. 3 can be constructed according to any of the light sensors illustrated FIG. 1A through FIG. 2C.

Additional details about the structure, fabrication, and operation of light sensors according to FIG. 1A through FIG. 3 can be found in U.S. patent application Ser. No. 12/584,474, filed on Sep. 4, 2009, entitled "Optical Device Having Light Sensor Employing Horizontal Electrical Field," and incorporated herein in its entirety.

FIG. 4A through FIG. 4D illustrate an alternative light sensor substituted for the light sensor shown on the optical devices of FIG. 1A through FIG. 3. The alternative light sensor FIG. 4A through FIG. 4D employs a light detection mechanism that is an alternative to the light detection mechanism in the light sensors of FIG. 1A through FIG. 3. FIG. 4A is a perspective view of the device. FIG. 4B is a cross-section of the light sensor. For instance, FIG. 4B is a cross-section of the device shown in FIG. 4A taken along the line labeled B. FIG. 4C is a cross-section of the waveguide. For instance, FIG. 4C is a cross-section of the device shown in FIG. 4A taken along the line labeled C. FIG. 4D is a cross-section of the optical device shown in FIG. 4C taken along the line labeled D and extending parallel to the longitudinal axis of the waveguide.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, light sensors that convert an light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

The waveguide 16 is defined in a light-transmitting medium 18 positioned on a base 20. For instance, the waveguide 16 is partially defined by a ridge 22 extending upward from slab regions of the light-transmitting medium 18. In some instances, the top of the slab regions are defined by the bottom of trenches 24 extending partially into the light-transmitting medium 18 or through the light-transmitting medium 18. Suitable light-transmitting media 18 include, but are not limited to, silicon, polymers, silica, SiN, GaAs, InP and LiNbO₃. One or more cladding layers are optionally positioned on the light-transmitting medium 18. The one or more cladding layers can serve as a cladding for the waveguide 16 and/or for the device. When the light-transmitting medium 18 is silicon, suitable cladding layers include, but are not limited to, silicon, polymers, silica, SiN, GaAs, InP and LiNbO₃.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 27 with a lower index of refraction than the light-transmitting medium 18. The drop in the index of refraction can cause reflection of a light signal from the light-transmitting medium 18 back into the light-transmitting medium 18. The base 20 can include the optical insulator 27 positioned on a substrate 28. As will become evident below, the substrate 28 can be configured to transmit light signals. For instance, the substrate 28 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serve as the optical insulator 27 and the silicon substrate can serve as the substrate 28.

The optical device also includes a light sensor 29 configured to receive a light signal guided by the one or more waveguides 16. The light sensor 29 is configured to convert the light signal to an electrical signal. Accordingly, the light signal can be employed to detect receipt of light signals. For instance, the light sensor 29 can be employed to measure the intensity of a light signal and/or power of a light signal. Although FIG. 4A illustrates a waveguide 16 carrying the light signal between the one or more components and the light sensor 29, the device can be constructed such that the waveguide 16 carries the light signal directly from an optical fiber to the light sensor 29.

The light sensor 29 includes a ridge 22 extending from slab regions positioned on opposing sides of the ridge 22. The tops of the slab regions are defined by the bottom of trenches 24 on opposing sides of the ridge 22. The ridge 22 includes an absorption layer 50. For instance, FIG. 4B shows a light-absorbing medium 32 that absorbs light signals serving as the absorption layer 50. Suitable light-absorbing media include media that upon being exposed to an electrical field produce an electron and hole pair in response to receiving a photon. Examples of light-absorbing media 32 that are suitable for detection of light signals in at the wavelengths commonly employed in communications applications includes, but are not limited to, germanium, silicon germanium, silicon germanium quantum well, GaAs, and InP. Germanium is suitable for detection of light signals having wavelengths in a range of 1500 nm to 1600 nm.

The absorption layer is positioned to receive at least a portion of a light signal traveling along the waveguide 16. As is evident from FIG. 4A, there is an interface between a facet of the light-absorbing medium 32 and a facet of the light-transmitting medium 18. The interface can have an angle that is non-perpendicular relative to the direction of propagation of light signals through the waveguide 16 at the interface. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The absorption layer 50 can be positioned on a seed portion 34 of the light-transmitting medium 18. In particular, the light-absorbing medium 32 of the light sensor 29 can be positioned on a seed portion 34 of the light-transmitting medium 18. The seed portion 34 of the light-transmitting medium 18 is positioned on the base 20. In particular, the seed portion 34 of the light-transmitting medium 18 contacts the insulator 27. The seed portion 34 of the light-transmitting medium 18 can be continuous with the light-transmitting medium 18 included in the waveguide 16 or spaced apart from the waveguide 16. When the light signal enters the light sensor, a portion of the light signal can enter the seed portion 34 of the light-transmitting medium 18 and another portion of the light signal enters the light-absorbing medium 32. Accordingly, the light-absorbing medium 32 can receive only a portion of the light signal. In some instances, the light sensor can be configured such that the light-absorbing medium 32 receives the entire light signal.

As will become evident below, during the fabrication of the device, the seed portion 34 of the light-transmitting medium 18 can be used to grow the light-absorbing medium 32. For instance, when the light-transmitting medium 18 is silicon and the light-absorbing medium 32 is germanium, the germanium can be grown on the silicon. As a result, the use of the light-transmitting medium 18 in both the waveguides 16 and as a seed layer for growth of the light-absorbing medium 32 can simplify the process for fabricating the device.

The light sensor also includes a charge layer 52 between a portion of multiplication layer 54 and the absorption layer 50. At least a portion of the multiplication layer 54 is positioned such that the absorption layer 50 is not located between the portion of the multiplication layer 54 and the base 20. For instance, the portion of the multiplication layer 54 can contact the base 20. In some instances, the multiplication layer 54 is positioned such that none of the absorption layer 50 is between the base 20 and the multiplication layer 54. As a result, the multiplication layer 54 and the absorption layer 50 can be positioned adjacent to one another on the base 20. Further, the multiplication layer 54 and the absorption layer 50 can be positioned adjacent to one another such that a line that is parallel to the top and/or bottom of the base 20 extends through both the multiplication layer 54 and the absorption layer 50.

Although the multiplication layer 54 is shown as a single layer of material, the multiplication layer 54 can include multiple layers of material. Suitable materials for the multiplication layer 54 include, but are not limited to, materials that upon being exposed to an electrical field and receiving an electron can excite additional electrons. Examples include, but are not limited to, semiconductor materials including crystalline semiconductors such as silicon. As a result, in some instances, the light-transmitting medium 18 and the multiplication layer 54 can be the same material and can be continuous. In FIG. 5B, the light-transmitting medium 18 and the multiplication layer 54 are shown as the same material.

The multiplication layer 54 can include a doped region 37 that serves as the charge layer 52. The multiplication layer 54 can also include an undoped region 56 positioned such that the doped region 37 of the multiplication layer 54 is between the undoped region 56 of the multiplication layer 54 and the absorption layer 50. The doped region 37 can be an N-type doped region or a P-type doped region. In one example, the multiplication layer 54 is a layer of silicon that includes a region doped with a p-type dopant and the doped region 37 is in contact with the absorption layer 50 as shown in FIG. 4B.

The light-absorbing medium 32 or the absorption layer 50 can include a first doped region 60 that serves as a field source for the electrical field to be formed in the ridge 22. For instance, FIG. 4B illustrates the light-absorbing medium 32 including a first doped region 60 that serves as a field source for the electrical field to be formed in the ridge 22. The first doped region 60 can be continuous and unbroken and can be included both the ridge 22 and in the slab region as is evident from FIG. 4B. In particular, the first doped region 60 can be included both in a lateral side of the ridge 22 and in the slab region. The light-absorbing medium 32 or the absorption layer 50 can also include an undoped region between the multiplication layer and the second doped region 62.

As is evident in FIG. 4B, the portion of the slab region that includes the first doped region 60 can also include or consist of the light-absorbing medium 32. As a result, the first doped region 60 can be formed in a single continuous medium. As an example the first doped region 60 can be formed in germanium that is included both in the ridge 22 and in the slab region. As is evident from FIG. 4B, the first doped region 60 can extend up to the top side of the light-absorbing medium 32. The first doped regions 60 can be an N-type doped region or a P-type doped region.

The multiplication layer 54 can include a second doped region 62 that serves as a field source for the electrical field to be formed in the ridge 22. The second doped region 62 can be continuous and unbroken and can be included both the ridge 22 and in the slab region as is evident from FIG. 4B. In particular, the second doped region 62 can be included both in a lateral side of the ridge 22 and in the slab region. As is evident in FIG. 4B, the portion of the slab region that includes the second doped region 62 can also include or consist of the same material as the multiplication layer 54. As a result, the second doped region 62 can be formed in a single continuous medium. As an example the second doped region 62 can be formed in silicon that is included both in the ridge 22 and in the slab region. As is evident from FIG. 4B, the second doped region 62 can extend up to the top side of the light-absorbing medium 32. The second doped regions 62 can be an N-type doped region or a P-type doped region.

An N-type doped region can include an N-type dopant. A P-type doped region can include a P-type dopant. Suitable dopants for N-type regions include, but are not limited to, phosphorus and/or arsenic. Suitable dopants for P-type regions include, but are not limited to, boron. The first doped region 60 and the second doped region 62 can be doped so as to be electrically conducting. A suitable concentration for the P-type dopant in a P-type doped region that serves as the first doped region 60 or the second doped region 62 includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region that serves as the first doped region 60 or the second doped region 62 includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

As noted above, a region of the multiplication layer 54 can be an N-type doped region or a P-type doped region that serves as the charge layer 52. Suitable dopants for N-type regions include, but are not limited to, phosphorus and/or arsenic. Suitable dopants for P-type regions include, but are not limited to, boron. Since the doped region 37 serves as the charge layer, that doped region 37 can have a lower concentration of dopant than the first doped region 60 and/or the second doped region 62. For instance, a suitable concentration for the P-type dopant in a doped region 37 that serves as the charge layer 52 includes, but is not limited to, concentrations greater than $1\times10^{15}$ cm$^{-3}$, $1\times10^{16}$ cm$^{-3}$, or $1\times10^{17}$ cm$^{-3}$, and/or less than $1\times10^{19}$ cm$^{-3}$, $1\times10^{20}$ cm$^{-3}$, or $1\times10^{21}$ cm$^{-3}$. A suitable concentration for the N-type dopant in a doped region 37 that serves as the charge layer 52 includes, but is not limited to, concentrations greater than $1\times10^{15}$ cm$^{-3}$, $1\times10^{16}$ cm$^{-3}$, or $1\times10^{17}$ cm$^{-3}$, and/or less than $1\times10^{19}$ cm$^{-3}$, $1\times10^{20}$ cm$^{-3}$, or $1\times10^{21}$ cm$^{-3}$.

In one example, the multiplication layer 54 includes or consists of silicon, the light-absorbing material includes or consists of silicon, the first doped region 60 is an p-type region with a dopant concentration of about $1\times10^{20}$ cm$^{-3}$, the second doped region 62 is an n-type region with a dopant concentration of about $1\times10^{20}$ cm$^{-3}$, and the second doped region 62 that serves as the charge layer is a p-type region with a dopant concentration of about $1\times10^{17}$ cm$^{-3}$.

The first doped region 60 and the second doped region 62 are each in contact with an electrical conductor 44 such as a metal. Accordingly, the first doped region 60 provides electrical communication between one of the electrical conductors 44 and the light-absorbing medium 32. In particular, the first doped region 60 provides electrical communication between an electrical conductor 44 and the light-absorbing medium 32 included in a lateral side of the ridge 22. The second doped region 62 provides electrical communication between one of the electrical conductors 44 and the multiplication layer 54. In particular, the second doped region 62 provides electrical communication between one of the electrical conductors 44 and the portion of the multiplication layer 54 at the lateral side of the ridge 22.

During operation of the light sensor, electronics (not shown) in electrical communication with the electrical contacts are used to apply a reverse bias between the first doped region 60 and the second doped region 62. When the first doped region 60 is a p-type region, the second doped region 62 is an n-type region, and the second doped region 62 that serves as the charge layer is a p-type region, a positive charge develops at the charge layer 52. As a result, there is an increased electrical field at the charge layer 52. When a photon is absorbed in the undoped region of the absorption layer, a hole and electron pair are generated. The electron is pulled toward the positive charge at the charge layer 52. The increased electrical field at the charge layer causes excites the electron and causes the electron to accelerate. The electron can accelerate to the extent that interaction of the electron with the lattice structure of the multiplication layer 54 excites additional hole and electron pairs. In turn, these electrons may excite further hole and electron pairs. In this way, a single photon results in the creation of multiple electrons. These electrons provide electrical current through the light sensor. The current level can be detected and/or measured by the electronics in order to determine the presence and/or intensity of the light signal. As a result, the creation of these additional electrons from a single photon increases the sensitivity of the light sensor.

The level of doping in the charge layer can affect the operation of the light sensor. For instance, the level of doing in the charge layer can be selected to cause a high level of electric field in the multiplication layer in order to achieve a high gain in the multiplication layer while also providing an electric field in the absorption layer that is low enough to reduce avalanche gain the absorption layer. The low gain in the absorption region can reduce free carriers that can absorb light without generating the electrical current that indicates the presence of light.

The light sensor can be configured to apply an electric field to the light-absorbing medium 32 that is substantially parallel to the base 20. For instance, the light-absorbing medium 32 can include lateral sides 52 that connect a bottom side 54 and a top side 37. The bottom side is located between the top side and the base 20. In some instances, the lateral sides are substantially perpendicular relative to the base 20.

As noted above, the light sensor is suitable for use with waveguide dimensions that are suitable for use in communications applications. Accordingly, a suitable height for the waveguide 16 (labeled h in FIG. 4C) includes, but is not limited to, heights greater than 1 µm, 2 µm, and 3 µm. A suitable width for the waveguide 16 (labeled w in FIG. 4C) includes, but is not limited to, widths greater than 0.5 µm, 2 µm, and 3 µm. Suitable waveguide dimension ratios (width of the waveguide 16:height of the waveguide 16) include, but are not limited to, ratios greater than 0.1:1, 0.3:1, and 0.5:1 and/or less that 0.7:1, 1:1, and 2:1. A suitable thickness for the slab regions adjacent to the waveguide includes, but is not limited to, a thickness greater than 0.1 µm, 0.15 µm, or 0.2 µm and/or less than 1.5 µm, 2 µm, or 3 µm.

In the light sensor, a suitable height for the ridge 22 (labeled H in FIG. 4B) includes, but is not limited to, heights greater than 0.5 µm, 1 µm, or 2.5 µm and/or less than 3.5 µm, 4 µm, or 5 µm. A suitable height for the light-absorbing medium 32 (labeled h in FIG. 4B) includes, but is not limited to, heights greater than 0.5 µm, 1.5 µm, or 2.5 µm and/or less than 3.5 µm, 4 µm, or 5 µm. As is evident in FIG. 4B, the slab region that includes the light-absorbing medium 32 can have a thickness that is different from the thickness of the slab region that excludes the light-absorbing medium 32. A suitable thickness for the slab region that includes the light-absorbing medium 32 includes, but is not limited to, a thickness greater than 0.1 µm, 0.15 µm, or 2 µm and/or less than 0.25 µm, 0.3 µm, or 0.35 µm. A suitable thickness for the slab region that excludes the light-absorbing medium 32 includes, but is not limited to, a thickness greater than 0.1 µm, 0.15 µm, or 0.2 µm and/or less than 0.25 µm, 0.3 µm, or 0.35 µm.

The width of the light-absorbing medium 32 included in the ridge 22 of the light sensor can affect the performance of the light sensor. For instance, increasing the width of the light-absorbing medium 32 can increase the portion of the light-absorbing medium 32 that receives the light signals from the waveguide 16 and can accordingly increase the efficiency of the light sensor. However, increasing this width can reduce the speed of the light sensor by increasing the distance that the electrons generated in the light-absorbing medium 32 travel through the light-absorbing medium 32. Similarly, the width of the multiplication region can slow the light sensor. As a result, it is desirable for the width of the multiplication region to be less than the width of the light-absorbing region. A suitable width ratio (width of the light-absorbing medium 32:width of the multiplication layer 54) includes widths ratios greater than 0.1:1, 0.3:1, or 0.5:1 and/or less than 0.6:1, 0.8:1, or 0.9:1. A suitable width for the light-absorbing medium 32 includes widths greater than 0.1 µm, 0.5 µm, or 1 µm and/or less than 1.5 µm, 2 µm, or 4 µm. A suitable width for the multiplication layer 54 includes widths greater than 0.1 µm, 0.2 µm, or 0.5 µm and/or less than 1 µm, 2 µm, or 3 µm.

In one example of the light sensor, the height for the ridge 22 is 3 µm, the height for the light-absorbing medium 32 is 2.73 µm, the thickness of the slab region that includes the light-absorbing medium 32 is 0.31 µm, and the thickness of the slab region that excludes the light-absorbing medium 32 is 0.21 µm. In this example, the width of the multiplication region is 0.25 µm and the width of the light-absorbing region is 0.8 µm.

Rather than using first doped region 60 and the second doped region 62 as the field sources, electrical conductors 44 such as metal can be used as the field sources. For instance, the first doped region 60 and the second doped region 62 need not be formed and electrical conductors can be formed over the locations of the first doped region 60 and the second doped region 62. The electrical conductors can then serve as the field sources.

FIG. 5 is a topview of the portion of an optical device according to any of FIG. 4A through FIG. 4C where the waveguide 16 is interfaced with the light sensor. The waveguide includes a taper 48. The taper 48 can be a horizontal taper and need not include a vertical taper although a vertical taper is an option. The taper 48 is positioned before the light sensor. For instance, the horizontal taper occurs in the light-transmitting medium 18 rather than in the light-absorbing medium 32. The taper 48 allows the light-absorbing medium 32 to have a narrower width than the waveguide 16. The reduced width of the light-absorbing medium 32 increases the speed of the light sensor. The optical component preferably excludes additional components between the taper and light sensor although other components may be present.

Figure 5A:
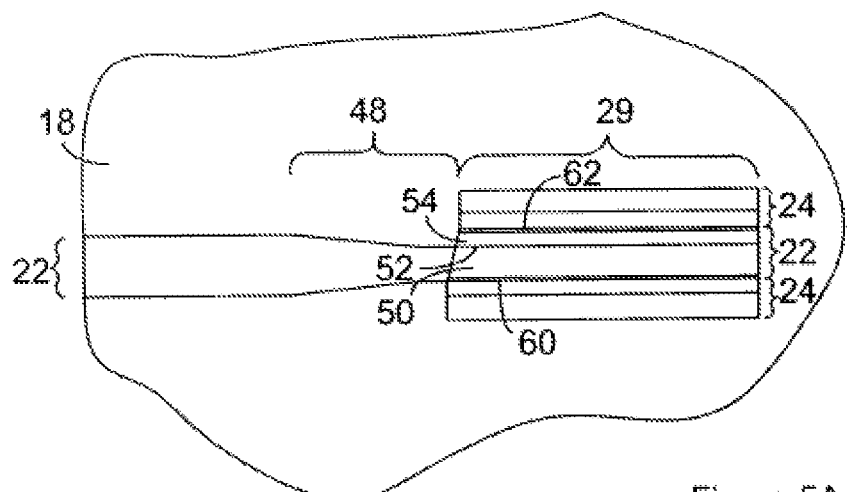
FIG. 5A is a topview of the portion of optical device where the waveguide is interfaced with the light sensor. The waveguide includes a taper.
Figure 5B:
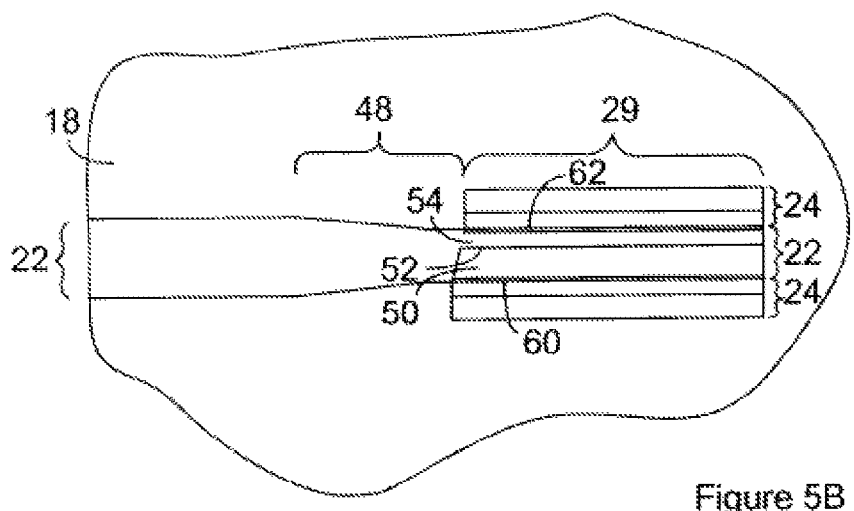
FIG. 5B is a topview of the portion of optical device where the waveguide is interfaced with the light sensor. The waveguide includes a taper.

FIG. 5A illustrates the waveguide aligned with the absorption layer 50. For instance, FIG. 5A shows the ridge 22 of the waveguide aligned with the absorption layer without any portion of the ridge being aligned with multiplication layer 54. This alignment can reduce the entry of light signals into the multiplication layer 54 while providing an efficient absorption of the light signal in the absorption layer. Alternately, the waveguide can be aligned with other portions of the light sensor that include the absorption layer 50. For instance, FIG. 5A illustrates the waveguide aligned with the ridge 22 of the light sensor rather than with only the absorption layer 50. In some instances, the narrower width that results from aligning the waveguide with the absorption layer 50 provides the light sensor with increased speed and/or efficiency.

Additional details about the structure, fabrication, and operation of light sensors according to FIG. 4A through FIG. 5 can be found in U.S. patent application Ser. No. 12/589,501, filed on Oct. 23, 2009, entitled "System Having Light Sensor with Enhanced Sensitivity," and incorporated herein in its entirety.

Figure 6A:
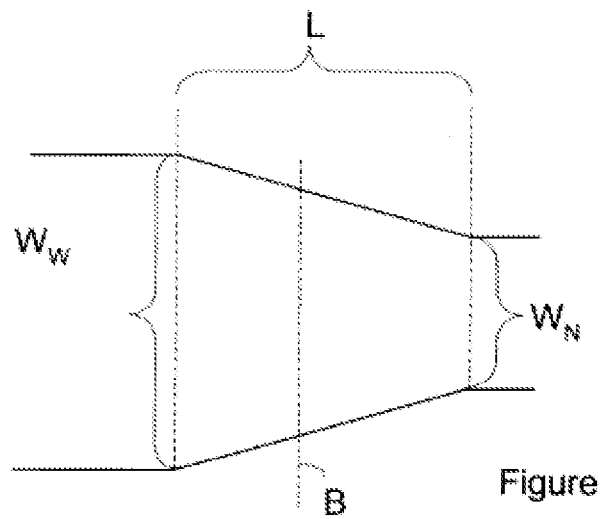
FIG. 6A and FIG. 6B illustrate the dimensions and construction of an abrupt taper according to FIG. 3 and/or FIG. 5.
Figure 6B:
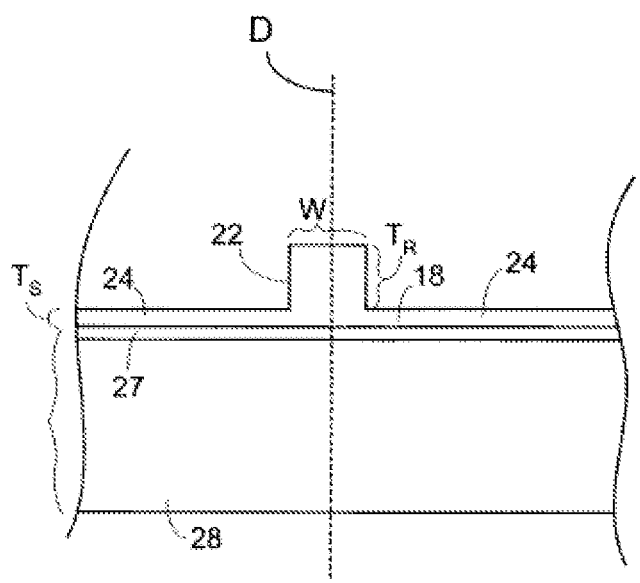

FIG. 6A and FIG. 6B illustrate the dimensions and construction of an abrupt taper according to FIG. 3 and/or FIG. 5. FIG. 6A is a topview of the taper and FIG. 6B is a cross section of the taper shown in FIG. 6A taken along the line labeled B in FIG. 6A. The width of the ridge is labeled W in FIG. 6A. The width of the ridge at the wide end of the taper is labeled $W_W$ in FIG. 6A and the width of the ridge at the narrow end of the taper is labeled $W_N$ in FIG. 6B. The length of the taper is labeled L in FIG. 6A. The thickness of the slab regions is labeled $T_S$ in FIG. 6B and the thickness of the ridge is labeled $T_R$ in FIG. 6B.

In order to achieve an abrupt taper, a suitable ratio for the width of the waveguide or ridge at a first location in the taper to the width of the waveguide or ridge at a second location in the taper is greater than 1.1:1, 2.5:1, or 3.5:1 where the distance between the first location and the second location is less than 3 µm, 20 µm, or 40 µm. As an example, a suitable ratio for $W_W:W_N$ is greater than 1.1:1, 2.5:1, or 3.5:1 when L is less than 3 µm, 16 µm, or 40 µm. In one example of a device having the dimensions set out above, the width of the ridge at the wide end of the taper, $W_W$, is greater than 0.5 µm, 2 µm, or 3 µm and/or the width of the ridge at the narrow end of the taper, $W_N$ is greater than 0.2 µm, 0.3 µm, or 0.4 µm and/or less than 0.6 µm, 1 µm, or 1.2 µm. In some instances, reducing the slab thickness, $T_S$, relative to the ridge width, W, can also increase the sensitivity and/or bandwidth of the light sensor. A suitable width ratio for $T_S$:W where W represents the width of the waveguide before the taper is less than 1:6, 1:5, or 1:4. Additionally or alternately, a suitable thickness ratio of slab thickness, $T_S$, relative to the ridge thickness, $T_R$, is greater than 1:30, 1:20, or 1:15 and/or less than 1:10, 1:5, or 1:2. In one example, the device has a slab thickness, $T_S$, less than 0.4 µm, 0.3 µm, or 0.2 µm.

Figure 7:
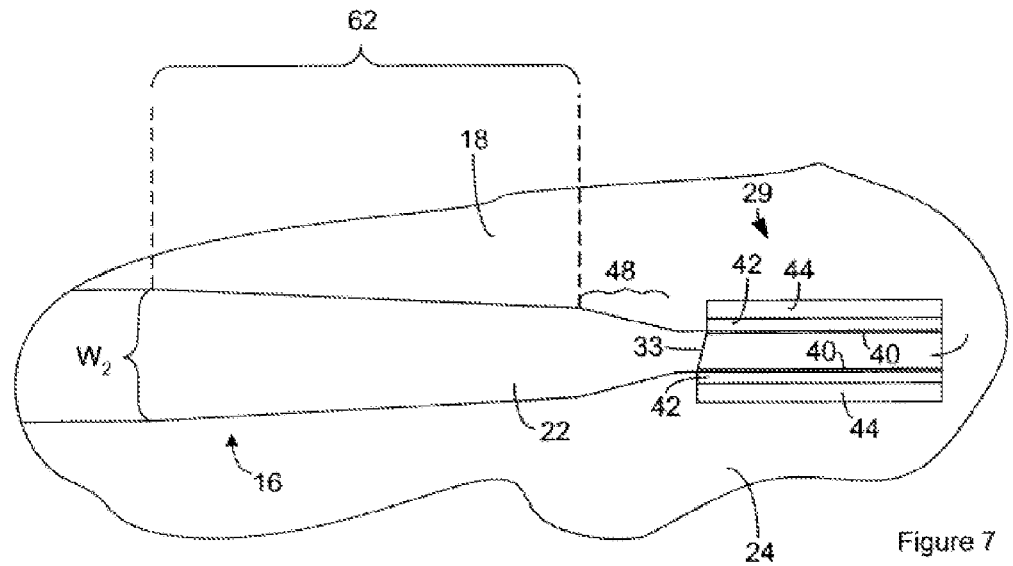
FIG. 7 is a topview of a device that includes an abrupt taper in conjunction with other tapers.

The abrupt taper disclosed above can also be used in conjunction with other tapers as shown in FIG. 7. FIG. 7 illustrates a secondary taper 62 before the abrupt taper discussed above. The width of the ridge at the wide end of the secondary taper 62 is labeled $W_2$. In some instances, the secondary taper 62 is a traditional taper designed to reduce the excitation of higher order modes. As a result, the width of the ridge at the wide end of the abrupt taper, $W_W$, can be narrower than the portion of the waveguide before the secondary taper 62 without the excitation of higher order modes. This arrangement can reduce the level higher order mode excitation relative to what would be achieved if the same degree of tapering were provided by only the abrupt taper. A suitable ratio for the width of the waveguide or ridge at a first location in the secondary taper 62 to the width of the waveguide or ridge at a second location in the secondary taper is less than 6:1, 3:1, or 2:1 where the distance between the first location and the second location is greater than 200 µm, 100 µm, or 50 µm. As an example, a suitable ratio for $W_2$:$W_W$ is less than 6:1, 3:1, or 2:1 when L is greater than 200 µm, 100 µm, or 50 µm. In one example of a device having the dimensions set out above, the width of the ridge at the wide end of the taper, $W_W$, is less than 2 µm, 1.5 µm, and 0.9 µm and/or greater than 0.7 µm, 0.6 µm, or 0.5 µm. In some instances, the dimensions of the secondary taper 62 are selected such that the secondary taper is an adiabatic taper. The secondary taper 62 can be a horizontal taper and need not include a vertical taper although a vertical taper is optional.

Figure 8:
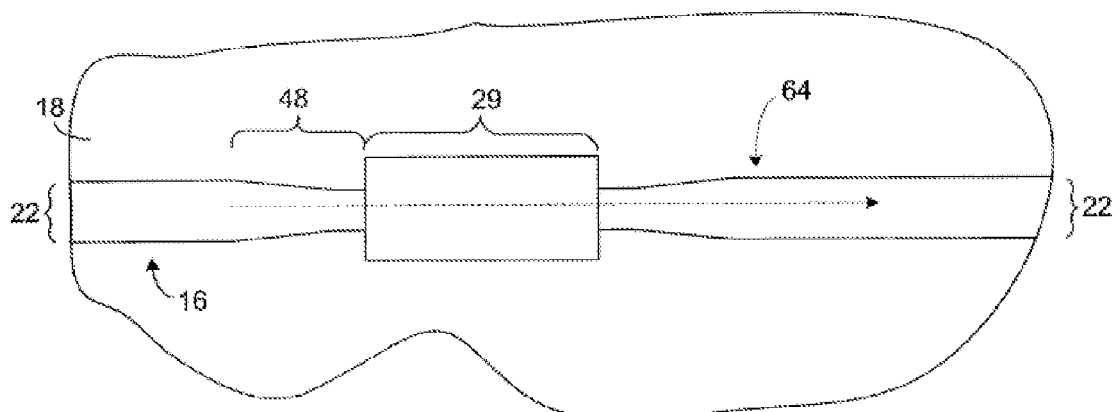
FIG. 8 is a topview of a light sensors positioned midway along an optical path.

The above light sensors are disclosed as being positioned on an optical path that terminates at the light sensor, however, the light sensors can be positioned midway along an optical path rather than at the end of the optical path. As an example, FIG. 8 illustrates an output waveguide 64 that the portion of the light signals that are not absorbed by the light sensor away from the light sensor. The output waveguide 64 is illustrated with a taper but need not include a taper or can include multiple tapers. The taper can be a taper such as the abrupt taper disclosed above or the secondary taper disclosed above. Any of the light sensors disclosed above can serve as the light sensor of FIG. 8.

Example 1

The bandwidths of the light sensors on eighteen different devices were compared. Nine of the devices included abrupt tapers before the light sensor and nine of the devices included tapers that were configured to stop the excitation of higher order modes. The light sensors were all constructed according to FIG. 2C.

The light sensors were tested for bandwidth with a vector network component analyzer. A high-speed RF signal was applied to an external high-speed modulator with a bandwidth of about 40 GHz. A reverse voltage bias of −0.5V was applied to the device through a bias-tee. The modulated light at 1550 nm was then coupled to the light sensor and the electrical output was measured through a high speed RF probe. The system, including RF cable, bias-tee, and modulator was calibrated and its response was factored out from the high-speed results to determine the 3 dB bandwidth.

The results of the bandwidth testing are shown in the following Table. Each row presents the results for a different device. Accordingly, a review of the Table shows that more than one device has the same dimensions. As a result, the variation in the results for different devices with the same dimensions is a result of fabrication variations.

| $W_W$ (µm) | $W_N$ (µm) | L (µm) | 3 dB Bandwidth (GHz) |
|---|---|---|---|
| 0.8 | 0.4 | 14 | 16.94 |
| 0.8 | 0.4 | 14 | 13.72 |
| 0.8 | 0.4 | 14 | 13.55 |
| 0.8 | 0.4 | 5 | 18.01 |
| 0.8 | 0.4 | 5 | 17.7 |
| 0.8 | 0.4 | 5 | 19.36 |
| 0.8 | 0.5 | 14 | 20.81 |
| 0.8 | 0.5 | 14 | 16.27 |
| 0.8 | 0.5 | 14 | 20.73 |
| 0.8 | 0.5 | 5 | 21.31 |
| 0.8 | 0.5 | 5 | 23.67 |
| 0.8 | 0.5 | 5 | 24.46 |
| 0.8 | 0.6 | 14 | 19.1 |
| 0.8 | 0.6 | 14 | 20.87 |
| 0.8 | 0.6 | 14 | 24.8 |
| 0.8 | 0.6 | 5 | 22.1 |
| 0.8 | 0.6 | 5 | 23.79 |
| 0.8 | 0.6 | 5 | 25.77 |

The Table shows that for the same values of $W_W$ and $W_N$, the bandwidth increases for shorter taper lengths (L). As a result, the Table shows that a more abrupt taper increases bandwidth.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:
1. An optical device, comprising:
   a light sensor on a base; and
   a waveguide on the base such that a light signal guided by the waveguide is received at the light sensor, the waveguide including a taper configured such that a ratio of a width of the waveguide at a first location in the taper:the width of the waveguide at a second location in the taper is greater than 1.2:1 where a length of the taper between the first location and the second location is less than 20 µm.
2. The device of claim 1, wherein the first location is at the wide end of the taper and the second location is at the narrow end of the taper.
3. The device of claim 1, wherein the waveguide is partially defined by a ridge extending from slab regions, the slab regions being on opposing sides of the ridge, and the width of the waveguide is equal to the width of the ridge.
4. The device of claim 3, wherein a ratio of a thickness of a slab region:a thickness of the ridge is less than 1:5.
5. The device of claim 3, wherein a wide end of the taper has a ratio of a thickness of a slab region:a width of the ridge less than 1:1.

6. The device of claim 1, wherein
- the light sensor includes a light-absorbing medium positioned to receive at least a portion of the light signal from the waveguide,
- the light sensor includes a ridge extending upwards from slab regions and the light-absorbing medium is included in the ridge and also in the slab regions,
- the light-absorbing medium includes doped regions positioned such that an application of a reverse bias between the doped regions forms an electrical field in the light-absorbing medium included in the ridge.

7. The device of claim 6, wherein the doped regions are positioned on opposing sides of the ridge.

8. The device of claim 6, wherein the light-absorbing medium included in each slab region is continuous with the light-absorbing medium included in the ridge.

9. The device of claim 1, wherein the first location is at a wide end of the taper and the second location is at a narrow end of the taper and the length of the taper between the first location and the second location is less than 10 μm.

10. The device of claim 9, wherein the length of the taper between the first location and the second location is less than 5 μm.

11. The device of claim 1, wherein the width of the waveguide at the first location is greater than 2 μm.

12. The device of claim 11, wherein the width of the waveguide at the first location is greater than 3 μm.

13. The device of claim 1, wherein a height of the waveguide is greater than 2 μm.

14. The device of claim 13, wherein the height of the waveguide is greater than 3 μm.

15. The device of claim 13, wherein the device is built on a silicon-on-insulator wafer and the waveguide is a ridge waveguide, and the height of the waveguide is a distance between a top of the ridge and an optical insulator of the silicon-on-insulator wafer.

16. The device of claim 1, wherein the device excludes an output waveguide that carries the light signal away from the light sensor.

17. The device of claim 1, wherein the light signal travels on an optical path through the waveguide, the optical path of the light signal having a constant thickness from a location before the taper and through the taper.

18. The device of claim 1, wherein the light signal travels on an optical path through the waveguide, the optical path does not expand vertically as the light signal enters the taper from a location before the taper.

19. The device of claim 1, wherein the second location is between the light sensor and the first location.

20. The device of claim 19, wherein the first location is at a wide end of the taper and the second location is at a narrow end of the taper, the length of the taper between the first location and the second location is less than 10 μm, and the ratio is greater than 2.5.

* * * * *